(12) United States Patent
Campbell et al.

(10) Patent No.: US 9,785,735 B1
(45) Date of Patent: Oct. 10, 2017

(54) PARALLEL INCREMENTAL GLOBAL ROUTING

(71) Applicant: International Business Machines Corporation, Armonk, NY (US)

(72) Inventors: Paul M. Campbell, Wappingers Falls, NY (US); Nathaniel D. Hieter, Clinton Corners, NY (US); Douglas Keller, Lagrangeville, NY (US); Adam P. Matheny, Hyde Park, NY (US); Alexander J. Suess, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/290,279

(22) Filed: Oct. 11, 2016

(51) Int. Cl.
*G06F 9/455* (2006.01)
*G06F 17/50* (2006.01)

(52) U.S. Cl.
CPC ...... *G06F 17/5077* (2013.01); *G06F 17/5081* (2013.01)

(58) Field of Classification Search
CPC ............. G06F 17/5077; G06F 17/5031; G06F 2217/84; G06F 17/5045; G06F 17/505; G06F 17/5081; G06F 2217/08
See application file for complete search history.

(56) References Cited

U.S. PATENT DOCUMENTS

| | | | |
|---|---|---|---|
| 5,495,419 A | 2/1996 | Rostoker et al. | |
| 5,602,754 A * | 2/1997 | Beatty | G06F 8/451 716/108 |
| 5,877,965 A * | 3/1999 | Hieter | G06F 17/505 716/108 |
| 6,099,580 A | 8/2000 | Boyle et al. | |
| 6,202,192 B1 * | 3/2001 | Donath | G06F 17/5031 716/108 |
| 6,230,306 B1 * | 5/2001 | Raspopovic | G06F 17/5077 716/129 |

(Continued)

FOREIGN PATENT DOCUMENTS

| | | |
|---|---|---|
| WO | 9618947 A1 | 6/1996 |
| WO | 2007078920 A1 | 7/2007 |
| WO | 2016033502 A1 | 3/2016 |

OTHER PUBLICATIONS

Najafi et al., "Configurable Hardware-based Streaming Architecture using Online Programmable-Blocks", 2015 IEEE 31st International Conference on Data Engineering, 2015, pp. 819-830.

*Primary Examiner* — Nha Nguyen
(74) *Attorney, Agent, or Firm* — Cantor Colburn LLP; Steven Meyers (57) ABSTRACT

A system and method perform global routing during integrated circuit fabrication. The method includes performing a design change in a portion of an integrated circuit design using a processor, determining whether the design change requires rerouting, and requesting a global routing lock based on determining that the design change requires the rerouting. The method also includes a router providing control of the global routing lock to one of two or more of the threads that request the global routing lock, and performing global routing for all of the two or more of the threads in parallel. A physical implementation of the integrated circuit design is obtained.

20 Claims, 5 Drawing Sheets

(56) References Cited

U.S. PATENT DOCUMENTS

| | | | |
|---|---|---|---|
| 6,269,469 B1* | 7/2001 | Pavisic | G06F 17/5077 703/15 |
| 6,557,145 B2 | 4/2003 | Boyle et al. | |
| 6,678,644 B1* | 1/2004 | Segal | G06F 17/5031 703/15 |
| 7,178,120 B2* | 2/2007 | Hieter | G06F 17/5072 716/105 |
| 7,500,216 B1 | 3/2009 | Blunno et al. | |
| 8,095,906 B2* | 1/2012 | Betz | G06F 17/5077 716/110 |
| 8,234,614 B1* | 7/2012 | Wen | G06F 17/5077 716/129 |
| 8,250,513 B1* | 8/2012 | Verma | G06F 17/5077 716/110 |
| 8,312,409 B1* | 11/2012 | Jain | G06F 17/5077 716/121 |
| 8,365,113 B1 | 1/2013 | Bhardwaj et al. | |
| 8,386,983 B1* | 2/2013 | Kingsley | G06F 17/5054 716/126 |
| 8,418,094 B2* | 4/2013 | Pedenon | G06F 17/5045 703/14 |
| 8,473,891 B1* | 6/2013 | Bosshart | G06F 17/5072 716/126 |
| 8,775,988 B2* | 7/2014 | Lavin | G06F 17/504 716/104 |
| 8,789,060 B1* | 7/2014 | Wadland | G06F 9/52 703/2 |
| 2005/0210218 A1 | 9/2005 | Hoogterp | |
| 2008/0077926 A1 | 3/2008 | Jeter et al. | |
| 2009/0119630 A1* | 5/2009 | Binder | G06F 17/5031 716/113 |
| 2009/0172623 A1* | 7/2009 | Cross | G06F 17/5045 716/119 |
| 2010/0115478 A1* | 5/2010 | Pedenon | G06F 17/5045 716/136 |
| 2010/0169858 A1* | 7/2010 | Betz | G06F 17/5077 716/131 |
| 2011/0055790 A1* | 3/2011 | Gao | G06F 17/5077 716/130 |
| 2012/0311515 A1* | 12/2012 | Zolotov | G06F 8/20 716/108 |
| 2013/0326458 A1* | 12/2013 | Kazda | G06F 17/5077 716/129 |
| 2015/0112591 A1 | 4/2015 | Kim et al. | |
| 2016/0127253 A1 | 5/2016 | Patel et al. | |
| 2016/0171147 A1* | 6/2016 | Chen | G06F 17/505 716/134 |

* cited by examiner

PARALLEL INCREMENTAL GLOBAL ROUTING

BACKGROUND

The present invention relates to integrated circuit (IC) design, and more specifically, to parallel incremental global routing.

The fabrication of an IC (i.e., chip) includes a number of phases from the logic design to the physical implementation. Once a logic design has been developed, the placement of logic elements is followed by the routing of wires to interconnect the elements, as needed. Based on the timing requirements of the design and how well those requirements have been met, these design, place, and route processes can be performed iteratively to finalize the design for physical implementation. Parallel optimization of the design can be achieved using a multi-threaded approach by partitioning the design into logic clusters and operating on each of the threads independently. When design changes are made locally, within a given thread, those changes can affect the chip-level (i.e., global) placement and global routing in the entire chip. Thus, an update of global placement and routing must be performed to account for the effect of local routing changes. While the placement updates can be performed relatively efficiently, the process of performing global routing based on changes within each thread, in turn, and the associated cost of long locks can undercut the efficiency gains of multi-threaded processing.

SUMMARY

According to an embodiment of the present invention, a method of performing global routing during integrated circuit fabrication includes performing a design change in a portion of an integrated circuit design using a processor; determining, using the processor, whether the design change requires rerouting; requesting, using the processor, a global routing lock based on the determining indicating that the design change requires the rerouting; providing, using a router, control of the global routing lock to one of two or more of the threads that request the global routing lock; and performing, using the router, global routing for all of the two or more of the threads in parallel. A physical implementation of the integrated circuit design is obtained.

According to another embodiment, a system to perform global routing during integrated circuit fabrication includes a processor to perform a design change in a portion of an integrated circuit design, determine whether the design change requires rerouting, and request a global routing lock based on determining that the design change requires the rerouting; and a router to provide control of the global routing lock to one of two or more of the processors that request the global routing lock, and perform global routing for the design changes of all of the two or more of the processors in parallel.

According to yet another embodiment, a computer program product for performing design of a portion of an integrated circuit includes a computer readable storage medium having program instructions embodied therewith that are executable by one or more processors to perform a method. The method includes performing a design change in the portion of an integrated circuit design, determining whether the design change requires rerouting, requesting, from a router, a global routing lock based on the determining indicating that the design change requires the rerouting; and determining, upon obtaining the global routing lock, whether global routing for the design change was completed by the router during control of the global routing lock by another processor associated with another portion of the integrated circuit design.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As previously noted, local design changes within one or more threads can lead to a wiring change that must be propagated to the global routing process. For example, the addition of a buffer requires the addition of wiring and, thus, requires an update of the global routing, but the replacement of one type of gate with another that does not result in any wiring changes does not require an update of the global routing. As also noted, global placement can be updated, as well. While global placement is updated based on design changes in a given thread, all other threads are locked out of making further placement changes. Because a relatively short lock is required to update global placement, this aspect of incorporating local changes into the chip place and route process is considered relatively scalable. When global routing is being updated, the router requires a static netlist, which is the listing of connections among chip components. Thus, while global routing is being updated, the netlist of not only the thread that initiated the update but also of all the threads associated with the chip design must be held static. To this end, a global routing lock is used. Because global routing is a relatively lengthy process (as compared to global placement, for example), a long lock is required during global routing.

A known approach to global routing involves updating the global routing based on the design changes in one thread at a time. The thread whose changes are being used to update the global routing is given control of a lock that prevents all other threads from making design changes. Any other threads that are waiting to access the global routing lock are provided access on a one-at-a-time basis after the current routing update is completed, the lock is released, and the other threads are permitted to make design changes that can require the global routing update. As previously noted, because the global routing process can be lengthy, the lock is referred to as a long lock. This long lock represents a loss in efficiency and does not scale well.

Turning now to an overview, one or more embodiments relate to modifying the global routing process to perform global routing in parallel for all threads that are waiting for the global routing lock. While one thread at a time is still given control of the global routing lock, the routing changes in the other waiting threads are also updated. Thus, the core model used to manage all the threads is updated based on all the netlist changes available in all the threads at the time that the lock is activated.

Figure 1:
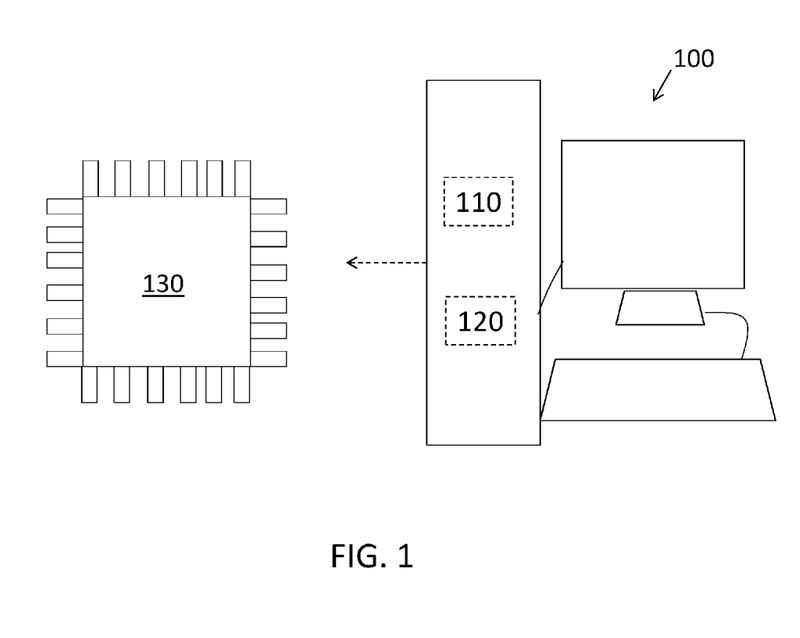
FIG. 1 is a block diagram of an exemplary processing system used to process one or more threads involved in integrated circuit (IC) design.

Turning now to a more detailed description of one or more embodiments, FIG. 1 is a block diagram of an exemplary processing system 100 used to process one or more threads associated with a chip design and the resulting physical implementation of the integrated circuit 130. The processing system 100 includes one or more memory devices 110 and one or more processors 120. Multiple of the processors 120 can be used to process multiple threads. In alternate embodiments, multiple processing systems 100 can be used to process the multiple threads. The memory device 110 stores instructions implemented by the processor 120. As further discussed below, these instructions include processes used to perform the design changes and timing updates.

Figure 2:
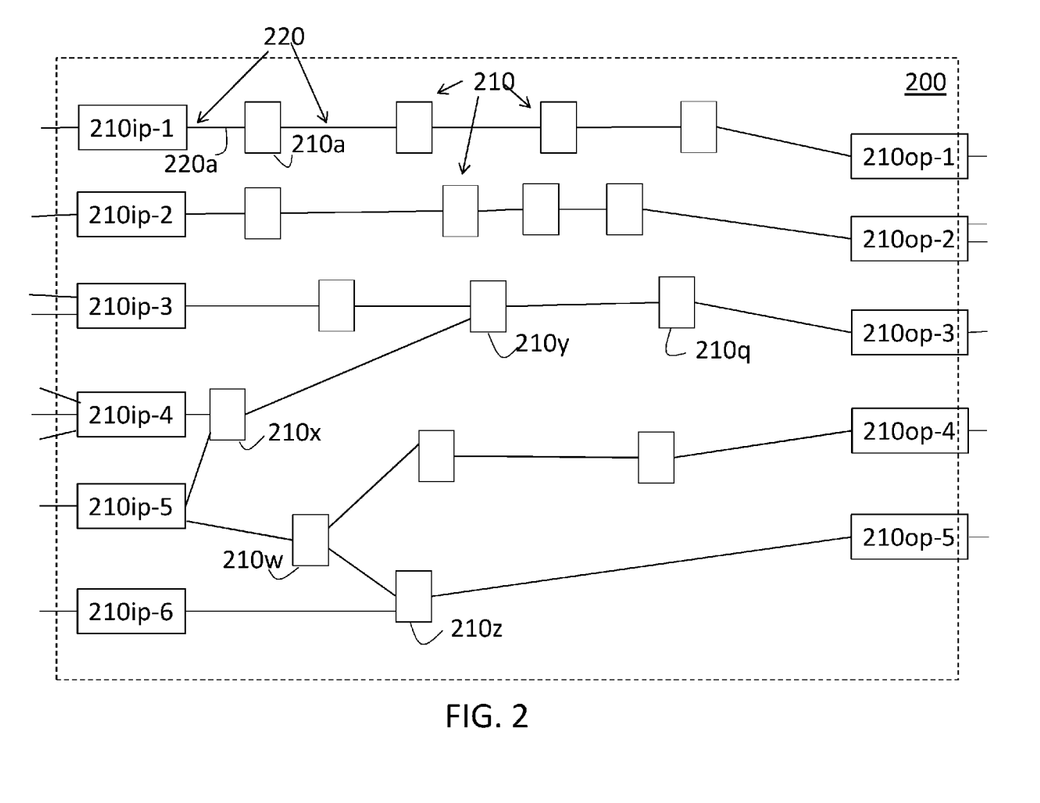
FIG. 2 is a block diagram of an exemplary logic cluster that is processed as a thread according to one or more embodiments.

FIG. 2 shows a block diagram of an exemplary logic cluster 200 that is processed as a thread according to one or more embodiments. The logic cluster 200 is a portion of the design of the chip that is processed as a thread according to one or more embodiments. The exemplary logic cluster 200 includes six input nodes 210$ip$-1 through 210$ip$-6 and five output nodes 210$op$-1 through 210$op$-5 with various other nodes 210 in between. The labels input and output are used only for explanatory purposes to indicate that these nodes form the borders of the exemplary logic cluster 200. Each node 210 represents a component such as a buffer or transistor, for example. Some of the nodes 210 between the input nodes 210$ip$ and the output nodes 210$op$ (i.e., nodes 210$a$, 210$q$, 210$w$, 210$x$, 210$y$, 210$z$) are additionally labeled for explanatory purposes. Nodes 210 are interconnected with edges 220 to form a path from each input node 210$ip$ to an output node 210$op$. Each edge 220 is wiring that is arranged according to the router.

As FIG. 2 indicates, some nodes 210 have more than one input. Input nodes 210$ip$-1, 210$ip$-2, 210$ip$-5, and 210$ip$-6 each have one input, while input node 210$ip$-3 has two inputs, and input node 210$ip$-4 has three inputs. Nodes 210$x$, 210$y$, and 210$z$ each have two inputs that originate at different input nodes 210$ip$. For example, the paths from both input nodes 210$ip$-4 and 210$ip$-5 are input to node 210$x$, and the output from node 210$x$ then intersects with the path originating from node 210$ip$-3 at node 210$y$. Thus, the exemplary logic cluster 200 shown in FIG. 2 begins with nine paths, and, due to two of the nodes 210 providing two outputs, there are eleven paths through the exemplary logic cluster 200 altogether.

Timing analysis of each logic cluster 200 involves the determination of delay through each node 210 and edge 220 of each path from an input node 210$ip$ to an output node 210$op$. This determination begins with the arrival time at the input of an input node 210$ip$ (or, in a similar process in the case of back propagation, the required arrival time at an output node 210$op$). This arrival time at the input of an input node 210$ip$ is added to the delay through the input node 210$ip$ to determine the arrival time at the input of the edge 220 connecting the input node 210$ip$ to the next node 210 in the path. The delay through the edge 220 is added to the arrival time at the input of the edge 220 to determine the arrival time at the input of the next node 210 and so on, until the output node 210$op$ is reached.

The path delay determination for a given logic cluster 200 thus relies on output from one or more previous design portions 200, which provide the arrival time at each input node 210$ip$ (except when the logic cluster 200 is the input portion of the entire chip design). The timing analysis discussed with reference to FIG. 2 is also the trigger for determining whether a design change is needed in one or more logic clusters 200 associated with one or more threads. That is, when one or more paths in the logic cluster 200 fails to meet timing requirements, a design change is needed, and that design change can require the addition or deletion of an edge 220 such that a global routing update is required.

Figure 3:
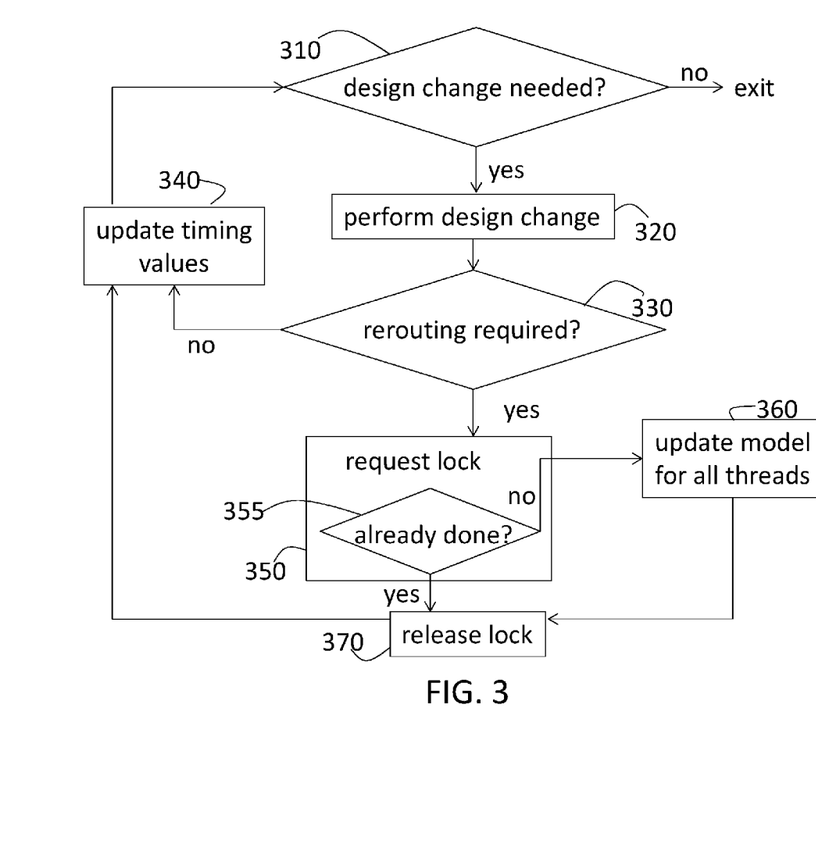
FIG. 3 is a process flow of a method of performing global routing according to one or more embodiments.

FIG. 3 is a process flow of a method of performing global routing according to one or more embodiments. The processes shown in FIG. 3 are performed for each thread in parallel. The process at block 360 is performed by the router for one or more threads. At block 310, a decision is made about whether a design change is needed. Part of the processing at block 310 in order to make the decision can be timing and performance analysis that is performed at the thread level or at the global level. Exemplary timing analysis is discussed with reference to FIG. 2. When timing requirements are not met for the logic cluster 200 associated with the thread, design changes can be made at the local thread level. When design changes are determined not to be needed, at block 310, the remainder of the processes shown in FIG. 3 need not be executed.

At block 320, performing a design change is based on the reason that a design change was deemed to be needed, at block 310. Thus, the portion of the logic cluster 200 associated with the thread that failed the timing requirement or other criteria are redesigned to improve performance. Exemplary design changes include the addition of a buffer or latch, the splitting or combining of a gate, or the replacement of a logic element. As previously noted, some design changes can require changes in the routing of the wires (edges 220) that interconnect logic elements (nodes 210) while other design changes can have no effect on routing. Thus, at block 330, a check is done of whether rerouting is required based on the design change.

If rerouting is not required, then timing values are updated at block 340. This process of updating timing values, at block 340, has a dependency on extraction in order to compute the standard timer quantities of wire delays and gate delays. Essentially, an extractor determines the new resistance and capacitance values associated with the design change (e.g., replacement of one gate with another) that did not require rerouting of wires (i.e., additions or deletions of edges 220) in this case. The timer then calculates propagated timing values (e.g., arrival time, slack) for the changed nets (i.e., paths). This extracted timing information is used in the next iteration of timing analysis, which, for explanatory purposes, is regarded as part of the check at block 310.

If it is determined, at block 330, that rerouting is required by the design change at block 320, then the thread proceeds to request the global routing lock at block 350. If the global routing lock is already under the control of another thread, then the requesting thread must wait. During the duration of the wait, other threads can also request the global routing lock and wait for its availability. Once the lock is released by the other thread, the global routing lock is assigned to one of the waiting threads. The assignment of the global routing lock to the next thread can be based on a random assignment to one of the waiting threads, for example. According to one or more embodiments, even if one of the waiting threads is not the next one to be assigned control of the global routing lock, its routing changes are processed by the router.

That is, when one thread that is given control of the global routing lock, the router executes the process to update global routing and the core model, at block 360, for all threads that have requested the global routing lock by the time the update at block 360 is initiated. The netlist modifications of each thread are processed in parallel and with consideration of all the modifications. This parallel processing of routing changes in multiple threads is a change from the prior approach of updating global routing based on only one thread at a time. Once global routing is updated, at block 360, the global routing lock is released at block 370. The thread that had control of the global routing lock and released the global routing lock returns to block 340 to update the thread's timing values in preparation for another iteration of optimization within the thread.

The activities that are restricted by the global routing lock for the other threads are also different from previous approaches. Previously, design changes (at block 320) by every thread were prohibited when any thread had control of the global routing lock. According to one or more embodiments, each thread can execute processes up to block 350 even while another thread has control of the global routing lock Because more than one thread can generate netlist modifications simultaneously according to one or more embodiments, each thread tracks its netlist changes for subsequent communication to the router. The router uses all the queued netlist changes when a new global routing process is initiated (at block 360). To be clear, one or more threads can modify its netlist and await control of the global routing lock (at block 350) while global routing is being updated (at block 360) based on a different thread. The processing at block 360 will account for all routing changes in all the waiting threads, regardless of which of the waiting threads is given control of the global routing lock.

When a thread has been waiting for control of the global routing lock (at block 350) and is then given control, it must first determine if global routing has already been updated based on local design changes during the processing (at block 360) for a different thread. If this is the case, according to the check at block 355, the thread can proceed to release the global routing lock at block 370 without repeating the processing at block 360.

Figure 4:
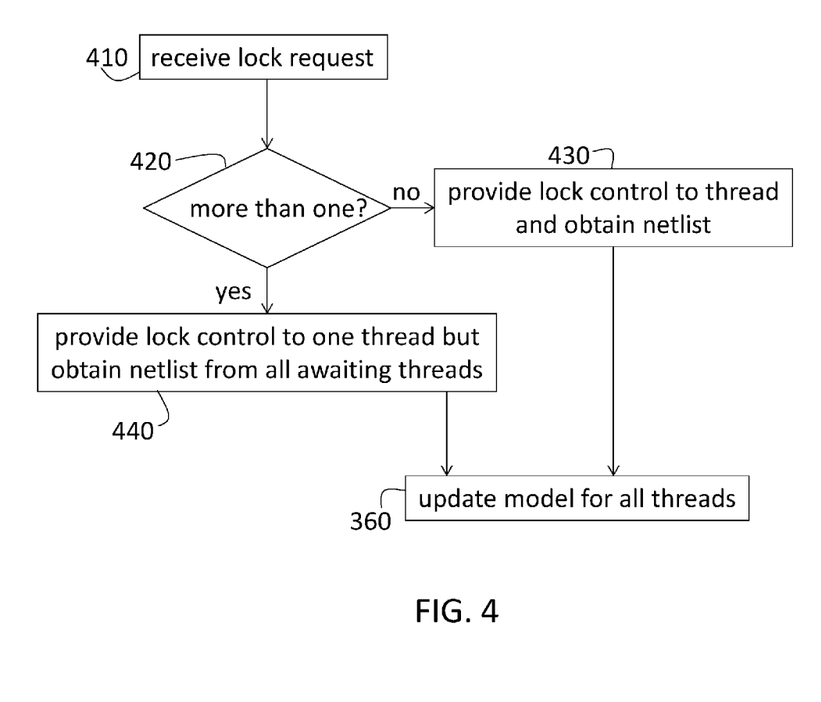
FIG. 4 is a process flow of a method of performing global routing according to one or more embodiments.

FIG. 4 is a process flow of a method of performing global routing according to one or more embodiments. The processes shown in FIG. 4 are performed by a processing system 100 that is dedicated to the router or, in alternate embodiments, can additionally process one or more threads. At block 410, the processes include receiving a global routing lock request. This process corresponds with the process at block 350 for a given thread. A determination is made, at block 420, of whether more than one such request is pending. There can be multiple requests for the global routing lock pending at the same time when two or more threads have reached block 350 in their own processing while the global routing lock was under the control of another thread.

When the determination at block 420 is that only one thread is waiting control of the global routing lock, the processing at block 430 is executed to provide that thread with control of the global routing lock and obtain the netlist from that thread. When the determination at block 420 is that more than one thread is waiting control of the global routing lock, the processing at block 440 is executed. At block 440, control of the global routing lock is provided to only one of the waiting threads, but netlist modifications are obtained from all the waiting threads. Whether from block 430 (pertaining to one thread) or from block 440 (pertaining to more than one thread), updating the model for all threads, at block 360, refers to updating the global routing, in parallel, with modified netlists from one or more threads (i.e., however many threads are determined to be waiting at block 420).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment of the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) (110) having computer readable program instructions thereon for causing a processor to carry out aspects of the present invention. An exemplary computer program product is discussed with reference to FIG. 5.

Figure 5:
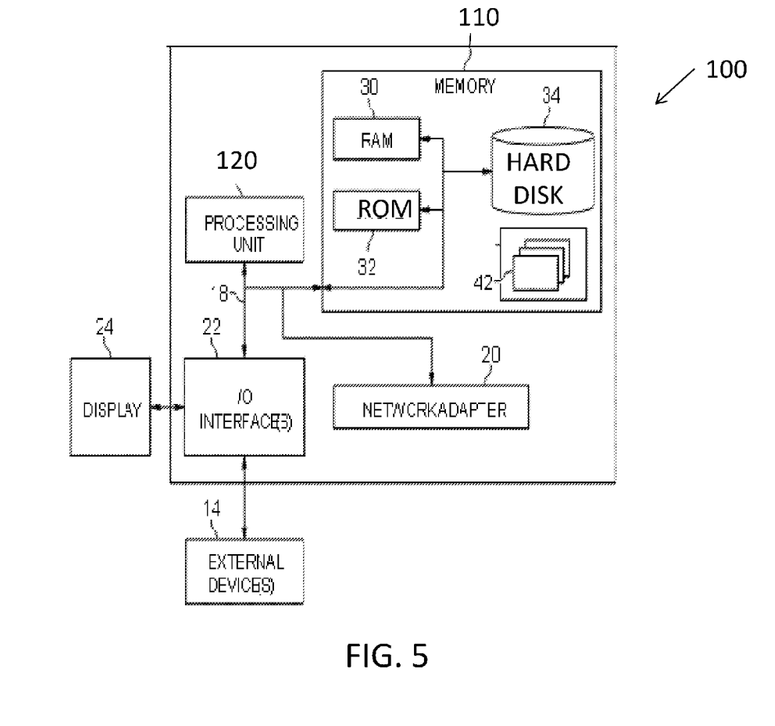
FIG. 5 is a detailed block diagram of an exemplary processing system according to embodiments.

FIG. 5 is a detailed block diagram of an exemplary processing system 100 according to embodiments. The computer readable storage medium (memory devices 110)

can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette 42, a hard disk 34, a random access memory (RAM) 30, a read-only memory (ROM) 32, an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire 18.

Computer readable program instructions described herein can be downloaded to respective computing/processing devices (120) from a computer readable storage medium 110 or to an external computer or external storage device (e.g., 14) via an input/output interface 22. The download to an external device 14 can be, for example, via the Internet, a local area network, a wide area network and/or a wireless network. The network may comprise copper transmission cables, optical transmission fibers, wireless transmission, routers, firewalls, switches, gateway computers and/or edge servers. A network adapter card 20 in each computing/processing device can receive computer readable program instructions from the network and forward the computer readable program instructions for storage in a computer readable storage medium (110) within the respective computing/processing device 100.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:
1. A computer-implemented method of performing global routing during integrated circuit fabrication, the method comprising:
   performing a design change in a portion of an integrated circuit design as a thread using a processor, wherein each of two or more of the threads operates on a respective one of the portions of the integrated circuit design;

determining using the processor, whether the design change requires rerouting;

requesting, using the processor, a global routing lock based on the determining indicating that the design change requires the rerouting, wherein the global routing lock maintains a network list for every portion of the integrated circuit design as static;

providing, using a router, control of the global routing lock to one of the two or more of the threads that request the global routing lock;

performing, using the router, global routing for all of the two or more of the threads in parallel during the control of the global routing lock by the one of the two or more of the threads and updating the network list based on the global routing for all of the two or more of the threads with consideration of all modifications of the network list for all of the two or more of the threads; and fabricating a physical implementation of the integrated circuit design based on the global routing.

2. The method according to claim 1, further comprising performing timing analysis for the portion of the integrated circuit design to determine the design change.

3. The method according to claim 1, further comprising updating timing values based on the determining indicating that the design change does not require rerouting.

4. The method according to claim 1, further comprising determining, using the processor, whether the global routing for the design change is completed upon obtaining the control of the global routing lock.

5. The method according to claim 4, further comprising releasing the global routing lock without the router performing the global routing again based on the determining that the global routing is completed.

6. The method according to claim 5, further comprising updating timing values following the releasing the global routing lock.

7. The method according to claim 1, further comprising performing the design change using another processor associated with another portion of the integrated circuit design simultaneously with the performing the global routing using the router.

8. A system to perform global routing during integrated circuit fabrication, the system comprising:

a processor configured to perform a design change in a portion of an integrated circuit design as a thread, wherein each of two or more of the threads operates on a respective one of the portions of the integrated circuit design, determine whether the design change requires rerouting, and request a global routing lock based on determining that the design change requires the rerouting, wherein the global routing lock maintains a network list for every portion of the integrated circuit design as static; and a router configured to provide control of the global routing lock to one of two or more of the threads that request the global routing lock, and perform global routing for the design changes of all of the two or more of the processors in parallel during the control of the global routing lock by the one of the two or more of the threads and updating the network list based on the global routing for all of the two or more of the threads with consideration of all modifications of the network list for all of the two or more of the threads, wherein, based on the global routing, the integrated circuit design is provided to fabricate a physical implementation of the integrated circuit design.

9. The system according to claim 8, wherein the processor performs timing analysis for the portion of the integrated circuit design to determine the design change.

10. The system according to claim 8, wherein the processor updates timing values based on determining that the design change does not require rerouting.

11. The system according to claim 8, wherein the processor determine whether the global routing for the design change is completed upon obtaining the control of the global routing lock.

12. The system according to claim 11, wherein the processor releases the global routing lock without the router performing the global routing again based on determining that the global routing is completed.

13. The system according to claim 12, wherein the processor updates timing values following releasing the global routing lock.

14. The system according to claim 8, further comprising another processor associated with another portion of the integrated circuit configured to perform a design change simultaneously with the router performing the global routing.

15. A computer program product for performing design of a portion of an integrated circuit, the computer program product comprising a computer readable storage medium having program instructions embodied therewith, the program instructions executable by one or more processors to perform a method comprising:

performing a design change in the portion of an integrated circuit design as a thread, wherein each of two or more of the threads operates on a respective one of the portions of the integrated circuit design;

determining whether the design change requires rerouting;

requesting, from a router, a global routing lock based on the determining indicating that the design change requires the rerouting, wherein the global routing lock maintains a network list for every portion of the integrated circuit design as static; and determining, upon obtaining the global routing lock, whether global routing for the design change was completed by the router during control of the global routing lock by another thread associated with another portion of the integrated circuit design, wherein, based on the global routing, the integrated circuit design is provided for physical implementation.

16. The computer program product according to claim 15, further comprising performing timing analysis to determine the design change.

17. The computer program product according to claim 15, further comprising releasing the global routing lock based on determining that the global routing for the design change was completed by the router.

18. The computer program product according to claim 17, further comprising updating timing values based on the releasing the global routing lock.

19. The computer program product according to claim 15, further comprising updating timing values based on the determining that the design change does not require rerouting.

20. The computer program product according to claim 15, wherein the performing the design change is done simultaneously with the router performing the global routing for another design change associated with another portion of the integrated circuit design.

* * * * *